(12) United States Patent
Wissner-Gross

(10) Patent No.: US 6,335,059 B1
(45) Date of Patent: Jan. 1, 2002

(54) METHOD OF ROBOTIC MANIPULATION UTILIZING PATTERNED GRANULAR MOTION

(75) Inventor: Alexander D. Wissner-Gross, New Hyde Park, NY (US)

(73) Assignee: The Mitre Corporation, McLean, VA (US)

(*) Notice: Subject to any disclaimer, the term of this patent is extended or adjusted under 35 U.S.C. 154(b) by 0 days.

(21) Appl. No.: 09/489,844

(22) Filed: Jan. 24, 2000

Related U.S. Application Data

(62) Division of application No. 09/372,619, filed on Aug. 12, 1999, now Pat. No. 6,216,631.

(51) Int. Cl.$^7$ ................................................ B01J 19/08
(52) U.S. Cl. .................... 427/457; 427/96; 427/185; 427/189; 427/197; 427/201; 427/261; 427/294; 427/430.1; 427/458; 427/565; 427/600; 427/601
(58) Field of Search .......................... 427/96, 457, 458, 427/565, 600, 601, 185, 189, 197, 201, 261, 294, 430.1

(56) References Cited

U.S. PATENT DOCUMENTS 5,102,690 A * 4/1992 Iyer et al.

OTHER PUBLICATIONS

Melo, Francisco, et al., "Transition to Parametric Wave Patterns in a Vertically Oscillated Granular Layer," *Physical Review Letters*, vol. 72, No. 1, 172–175 (Jan. 3, 1994).

Montemerlo, M.S., et al., "Technologies and Designs for Electronic Nanocomputers," MITRE Report No. MTR 96W0000044 (1996), (No month avail.).

Ren, Z.F., "Synthesis of Large Arrays of Well–Aligned Carbon Nanotubes on Glass," *Science*, vol. 282, 1105–1107 (Nov. 6, 1998).

Shinbrot, Troy., "Competition Between Randomizing Impacts and Inelastic Collisions in Granular Pattern Formations," *Nature*, vol. 389, 574–576 (Oct. 9, 1997).

Smalley, Richard E., et al., "Self–Assembly of Fullerene Tubes and Balls", (No month avail.).

Tans, W., et al., "Individual Single–Wall Carbon Nanotubes as Quantum Wires," *Nature*, vol. 386, 474–477 (Apr. 3, 1997).

Thess, A., et al., "Crystalline Ropes of Metallic Carbon Nanotubes," *Science*, vol. 273, 484–487 (Jul. 26, 1996).

Umbanhowar, Paul B., "Localized Excitations in a Vertically Vibrated Granular Layer," *Nature*, vol. 382, 793–796 (Aug. 29, 1996).

Umbanhowar, Paul B., "Patterns in the Sand," *Nature*, vol. 389, 541–542 (Oct. 9, 1997).

(List continued on next page.)

*Primary Examiner*—Bernard Pianalto
(74) *Attorney, Agent, or Firm*—Rosenberg, Klein & Lee

(57) ABSTRACT

A system (100, 100', 100") and method for robotic manipulation of objects (130) is provided wherein particulates (110, 110') are agitated by the transfer of energy thereto to establish patterned granular motion of the particulates (110, 110'). The patterned granular motion of the particulates (110, 110') forms standing waves (112). The objects (130) align themselves with the standing waves (112) and thus are dynamically arranged in a configuration established by the location of the standing waves (112). The location of the standing waves (112) can be predetermined by controlling the waveform of the signals applied to the energy application system (140). The predetermined waveforms are supplied from the signal source (150, 154) to the energy application system (140).

15 Claims, 14 Drawing Sheets

OTHER PUBLICATIONS

Whetten, Robert L., et al., "Fullernes Under Extreme Temperatures and Stress: Collisions of Fullerenes with Surfaces and with Other Fullerenes," Proceedings of the Adriatico Research Conference: Clusters and Fullerenes, New Jersey, World Scientific Publishing Co. (Conference date: Jun. 23–26, 1992), (No month avail.).

Wassgren, C.R., et al., "Vertical Vibration of a Deep Bed of Granular Material in a Container," *Journal of Applied Mechanics*, vol. 63, No. 3, 712–719 (Sep. 1996).

Das, Pranab K., et al., "Phase Boundaries in Vertically Vibrated Granular Materials," *Physics Letters* A, vol. 242, No. 6, 326–328 (Jun. 8, 1998).

Shvartsburg, Alexandre A., et al., "Mobilities of Carbon Cluster Ions: Critical Importance of the Molecular Attractive Potential," *Journal of Chemical Physics*, vol. 108, No. 6 (Feb. 8, 1998).

Falvo, M.R., et al., "Bending and Buckling of Carbon Nanotubes Under Large Strain," *Nature*, vol. 389, 582–584 (Oct. 9, 1997).

Falvo, M.R., et al, "Nanometre–Scale Rolling and Sliding of Carbon Nanotubes," *Nature*, vol. 397, 236–238 (Jan. 21, 1999).

Guo, Ting, et al, "Self–Assembly of Tubular Fullerenes," *Journal of Physical Chemistry*, vol. 99, No. 26, 10694–10697 (1995), (No month avail).

Hertel, Tobias, et al., "Manipulation of Individual Carbon Nanotubes and Their Interaction with Surfaces," *Journal of Physical Chemistry B*, vol. 102, Issue 6, 910 (1998), (No month avail.).

Lee, Young Hee, et al., "Catalytic Growth of Single–Wall Carbon Nanotubes: An Ab Initio Study," *Physical Review Letters*, vol. 78, No. 12, 2393–2396 (Mar. 24, 1997).

Lent, C.S., et al., "Quantum Cellular Automata," *Nanotechnology*, vol. 4, 49 (1993), (No month avail.).

Melo, Francisco, et al., "Hexagons, Kinks, and Disorder in Oscillated Granular Layers," *Physical Review Letters*, vol. 75, No. 21, 3838–3841 (Nov. 20, 1995).

Feynman, Richard, "There's Plenty of Room at the Bottom; An Invitation to Enter a New Field of Physics," *Engineering and Science*, California Institute of Technology (Feb. 1960).

Gamaly, Eugene, G., et al., "On the Mechanism of Carbon Nanotube Formation in the Arc Discharge," in Physics and Chemistry of Fullerenes and Derivatives: Proceedings of the International Winterschool on Electronic Properties of Novel Materials, H. Kuzmany et al., ed., World Scientific Publishing Co., 546–550 (1995), (No month avail.).

Yakobson, B.I., et al., "Nanomechanics of Carbon Tubes; Instabilities Beyond Linear Response," *Physical Review Letters*, vol. 76, No. 14, 2511–2514 (Apr. 1, 1996).

Zhong, W., et al., "Total Energy Calculations for Extremely Large Clusters; The Recursive Approach," *Solid State Communications* 86, 607–612 (1993), (No month avail.).

* cited by examiner

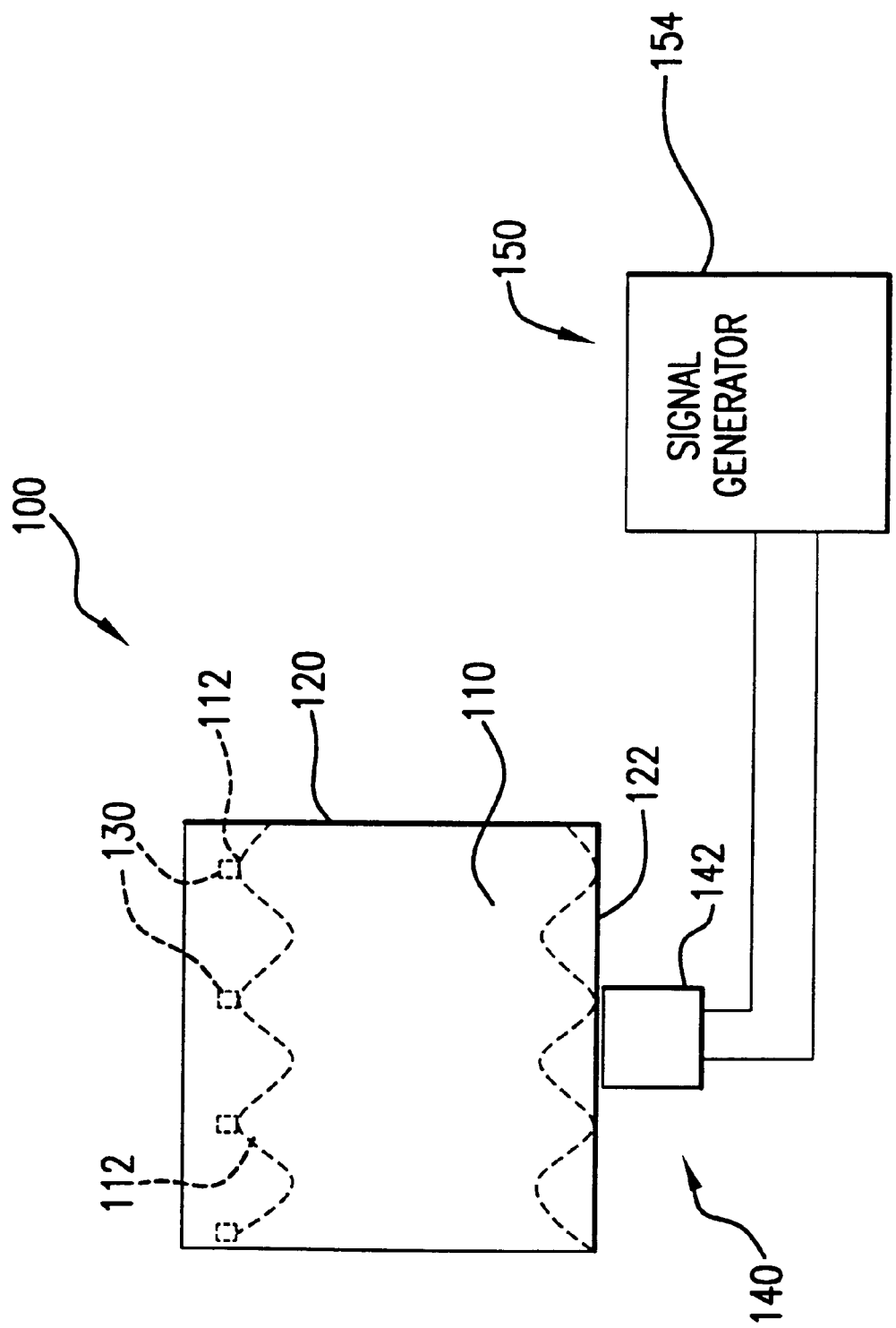

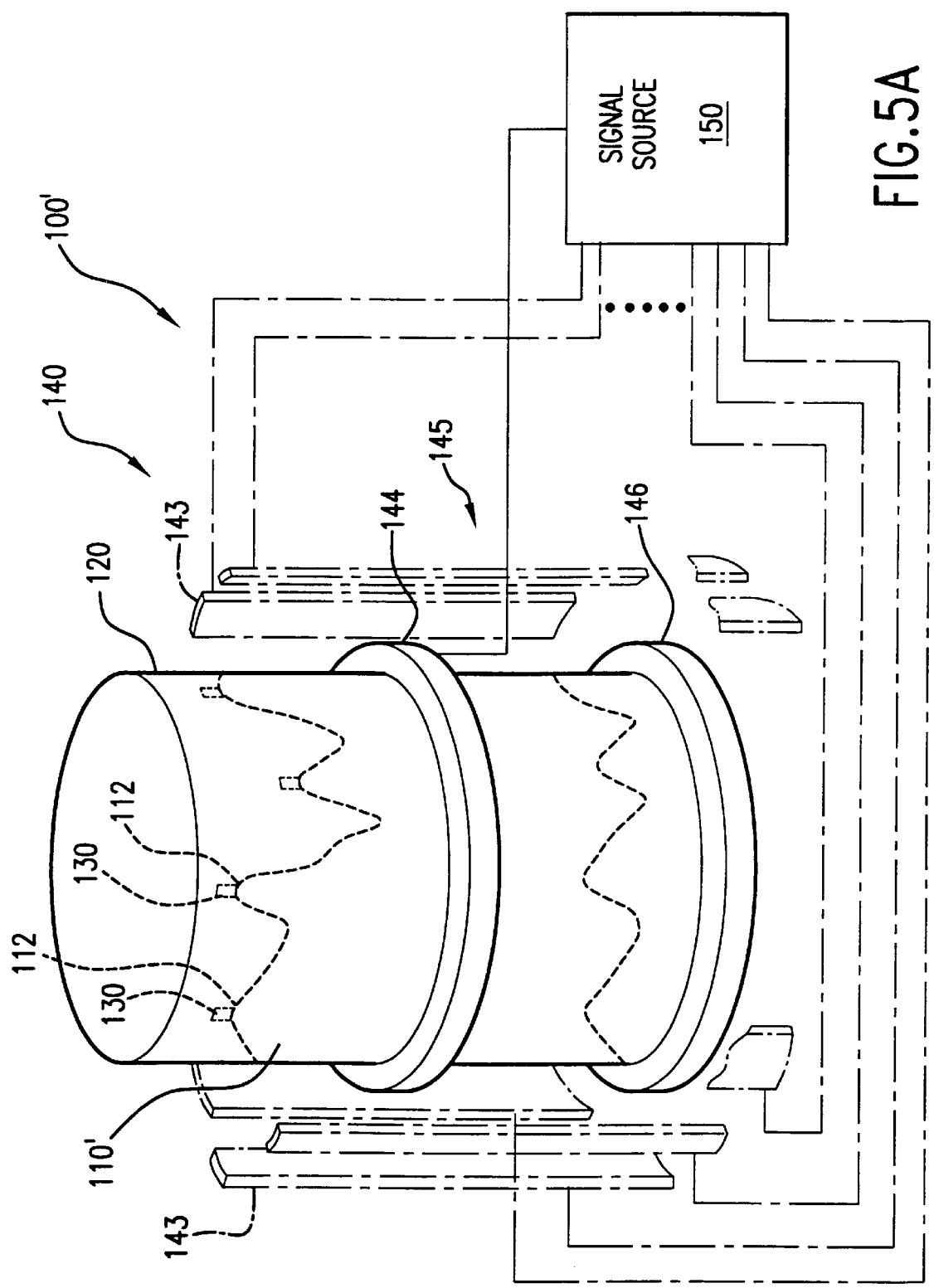

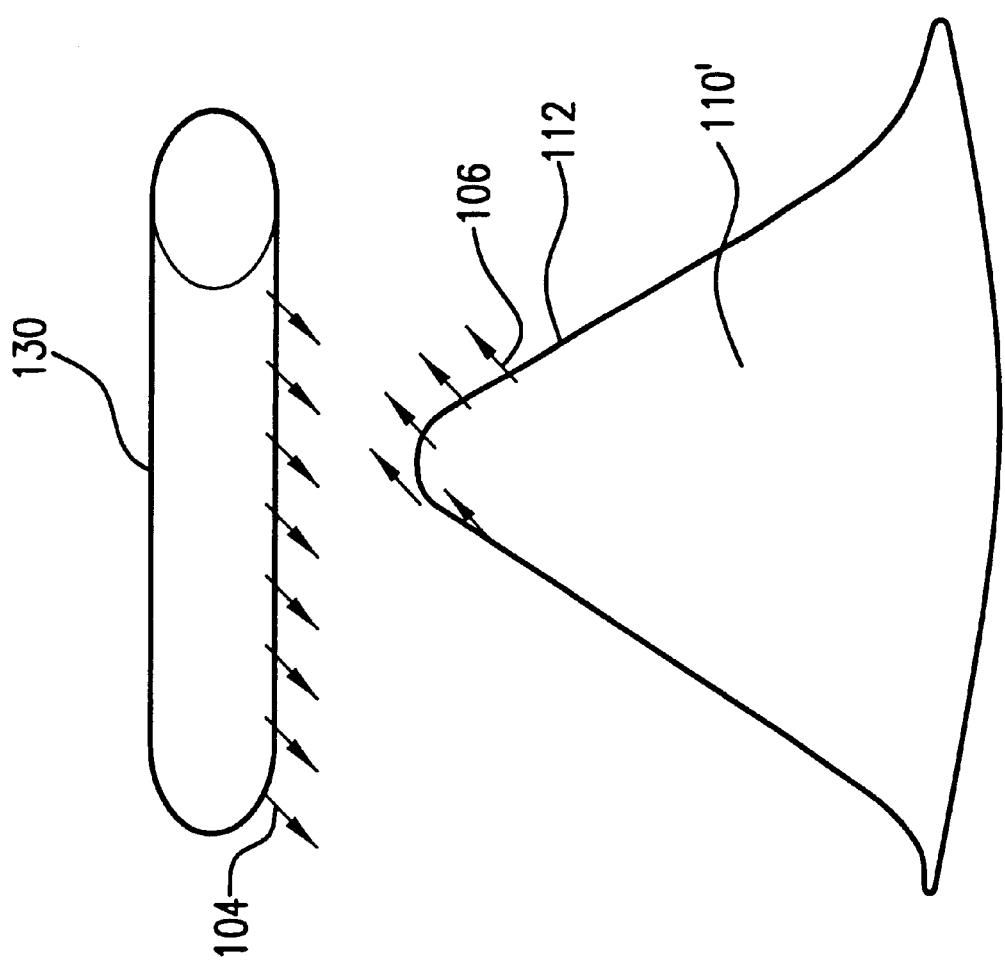

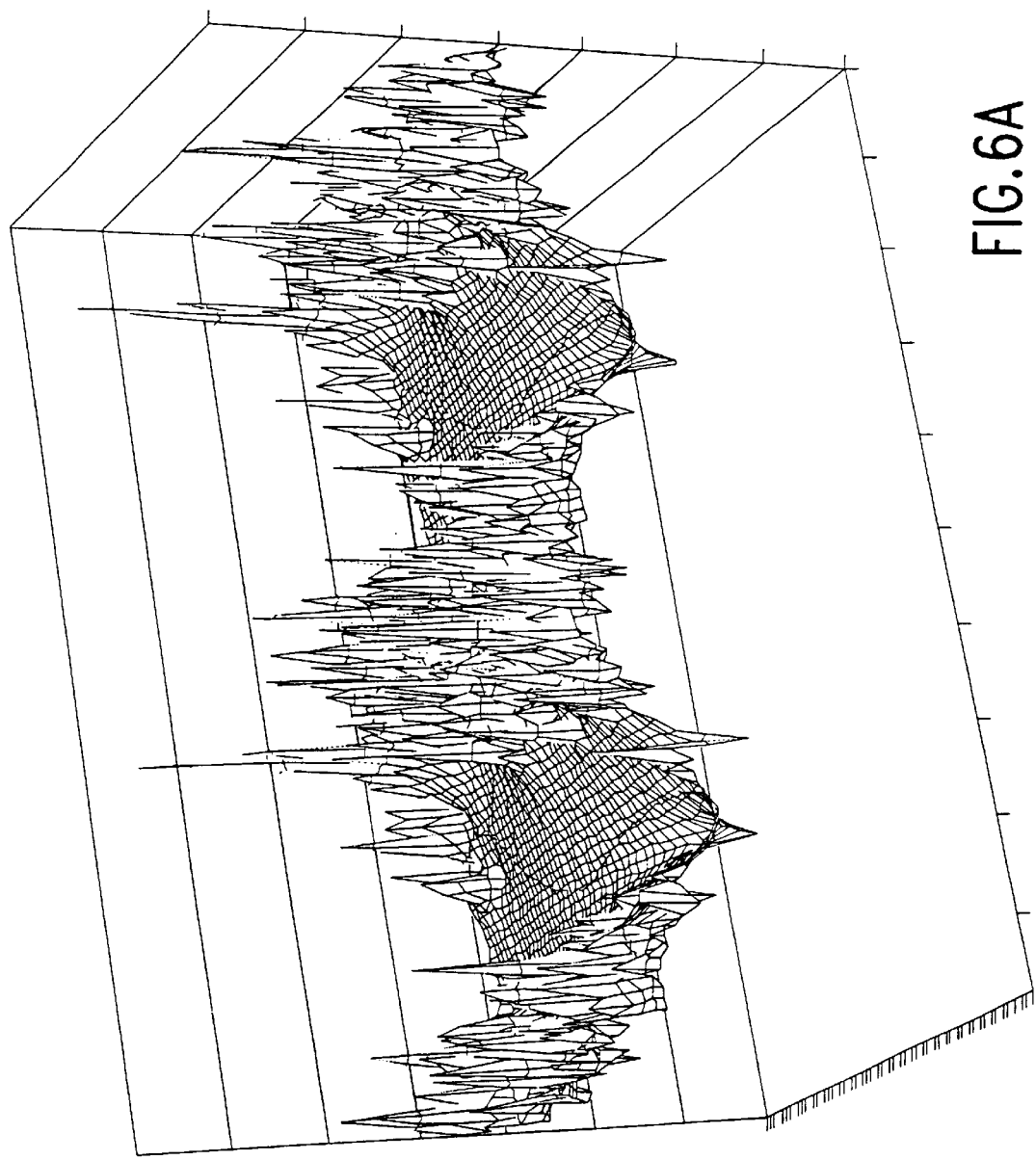

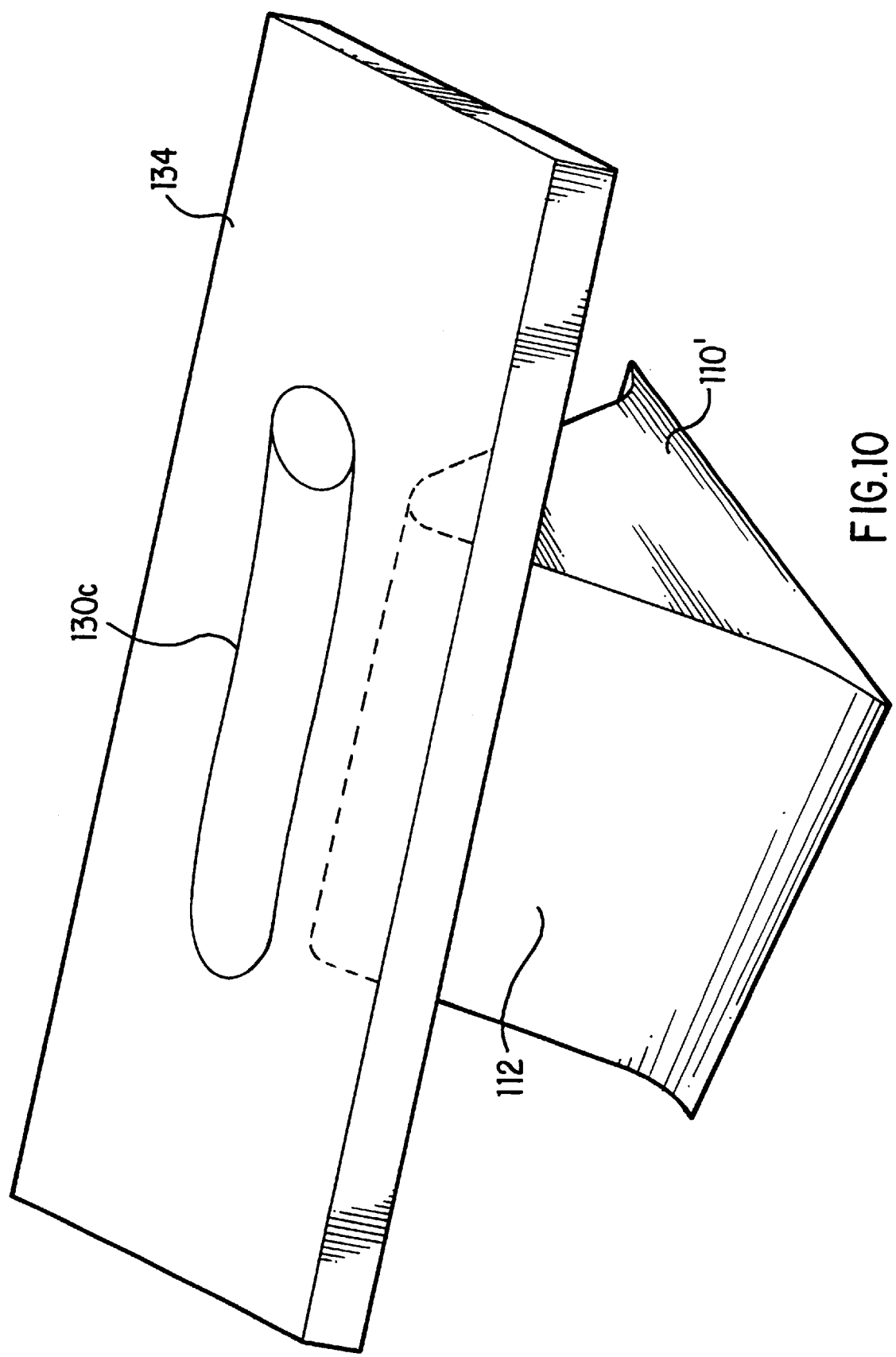

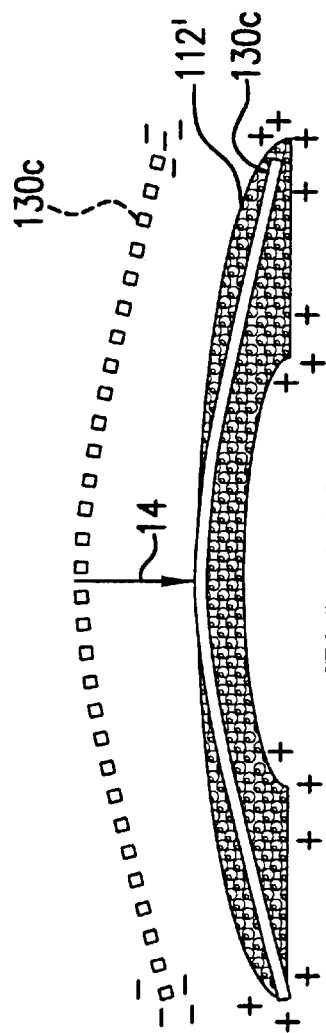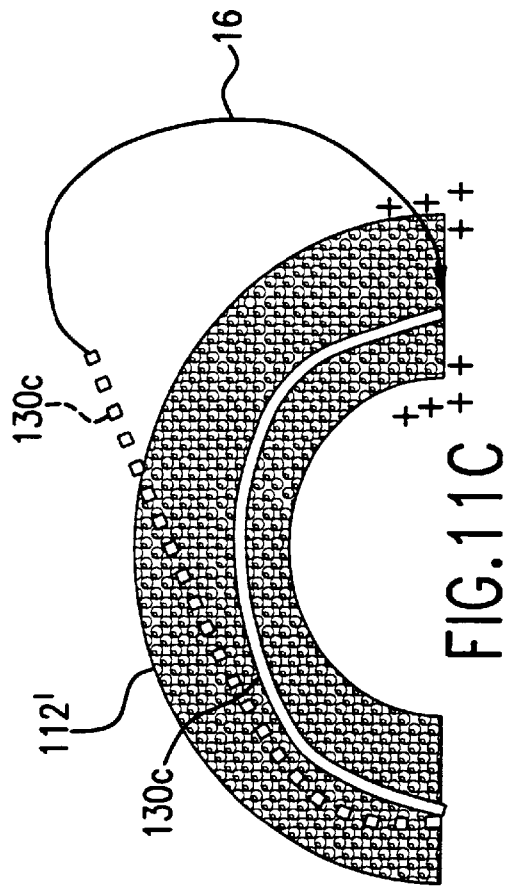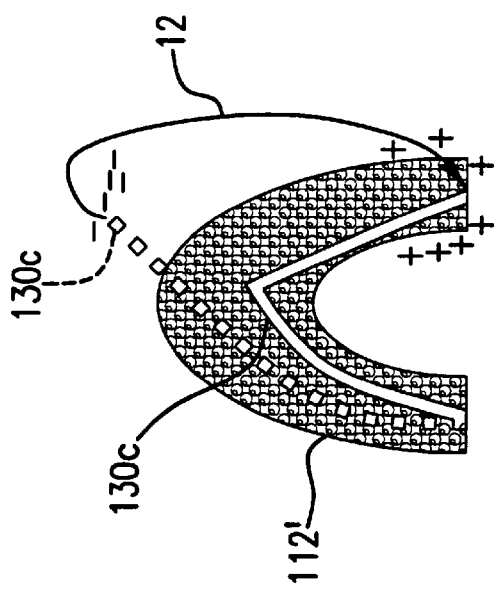
FIG.11A
FIG.11B
FIG.11C

METHOD OF ROBOTIC MANIPULATION UTILIZING PATTERNED GRANULAR MOTION

This application is a divisional of application Ser. No. 09/372,619 filed on Aug. 12, 1999 now U.S. Pat. No. 6,216,631.

BACKGROUND OF THE INVENTION

1. Field of the Invention

This invention directs itself to the use of patterned granular motion for robotic manipulation of a plurality of objects. In particular, this invention directs itself to the use of patterned granular motion phenomena, wherein a plurality of standing waves of particulates are positioned by controlling the waveform of energy transferred to the particulates. More in particular, this invention pertains to the use of patterned granular motion where molecules are used as the particulates, wherein the molecules are agitated by the interaction between charges on the molecules and an electric field applied thereto. Still further, this invention directs itself to the formation of nanometer-scale assemblies or systems, wherein nanometer-sized components are dynamically arranged by the electric fields which are formed by the standing waves of particulates that are established when patterned granular motion is induced by the transfer of energy to those particulates.

2. Prior Art

The evolution of solid-state electronics from discrete devices to packaged circuits and systems of ever-increasing complexity has been successful, in part, due to the ability to produce the complex combinations of circuit elements en masse. The ability to produce multiple identical circuits simultaneously provides an efficiency that makes the costs of the circuits attractive for industrial and commercial use. The evolution of such circuits utilizing ever smaller components and circuit patterns is pressing mass production methods for such solid-state devices to their limits.

Now that nanoscale electronic components and circuits, formed by single molecules, have been realized, mass production techniques for the assembly of nanoscale circuits and systems are needed. Currently, mechanosynthesis utilizing a scanning tunneling microscope or an atomic force microscope is used to manipulate molecular wires and devices, serially producing one nanoscale circuit at a time. While chemosynthesis promises to produce a multiplicity of molecular circuits simultaneously, methods for segregating each circuit produced have not evolved as yet. Thus, there is no practical method available to produce multiple nanoscale integrated-like circuit structures simultaneously. Likewise, there are no practical methods available to assemble multiple nanoscale mechanical assemblies or quantum systems simultaneously.

Patterned granular motion is a recently discovered, distinctive mechanical behavior, observed in thin layers of granular media undergoing periodic vertical oscillation. This phenomenon is characterized by the formation of standing waves of the granular media. These standing waves are generated by the application of vertical oscillation in the thin granular layers. Unique patterns of standing waves can be formed, with such patterns as square, striped, oscillon, and hexagonal thus far having been identified.

The granules are typically formed by glass or metallic spheres having a diameter ranging from 0.05–3 mm. To date, the interest in patterned granular motion has been substantially academic, without significant industrial application.

SUMMARY OF THE INVENTION

It is therefore an object of the present invention to provide a system and method for bulk-effect robotic manipulation utilizing the phenomenon of patterned granular motion. The system for robotic manipulation of a plurality of objects includes a container for receiving the objects therein. A plurality of particulates are disposed in the container and an assembly for applying energy to the plurality of particulates is provided to establish patterned granular motion thereof and thereby form a plurality of repeating vertically directed standing waves. A signal generator is provided that is coupled to the energy application assembly for supplying the energy with predetermined waveforms to dynamically position the standing waves at predetermined positions one with respect to another. The predetermined positions of the standing waves dynamically arrange the objects in a predetermined configuration. From another aspect, a method for robotic manipulation of a plurality of objects is provided wherein a container is provided and a plurality of particulates are provided in the container. A plurality of objects to be manipulated are added to the container and the plurality of particulates are agitated with energy having predetermined waveforms to generate standing wave patterns therewith. The standing wave patterns of particulates dynamically arrange the objects. A substrate is positioned in the container, with the substrate being adapted for adhesion of the objects thereto.

BRIEF DESCRIPTION OF THE DRAWINGS

FIG. 3 is a schematic block diagram illustrating one embodiment of the present invention;

FIG. 5A is a schematic illustration of the embodiment of FIG. 5 showing exemplary electric field emission electrode arrangements of the present invention;

FIG. 6 is a schematic illustration of an object being manipulated by the alternate embodiment of the present invention;

FIG. 6A is a three-dimensional plot illustrating Coulombic field intensities derived from a computer simulation of the present invention;

FIG. 10 is a schematic illustration of the present invention wherein the object being manipulated is a carbon nanotube;

FIGS. 11A, 11B and 11C are schematic illustrations of a carbon nanotube being deformed in various ways by the present invention; and, FIG. 12 is a schematic illustration of the present invention incorporating feedback.

DESCRIPTION OF THE PREFERRED EMBODIMENTS

Referring to FIGS. 1–11, there is shown, robotic manipulation system 100, 100' for dynamically manipulating objects utilizing patterned granular motion. As will be seen in following paragraphs, robotic manipulation system 100, 100' is specifically directed to the concept of bulk manipulation of objects to fabricate a multiplicity of structures in parallel. Robotic manipulation system 100' is particularly directed to application of nanometer scale assemblies or systems, such as the dynamic arrangement of molecules to provide a circuit pattern, position a molecular electronic device, form a mechanical structure or sort molecules by positioning one type relative to another.

Figure 1:
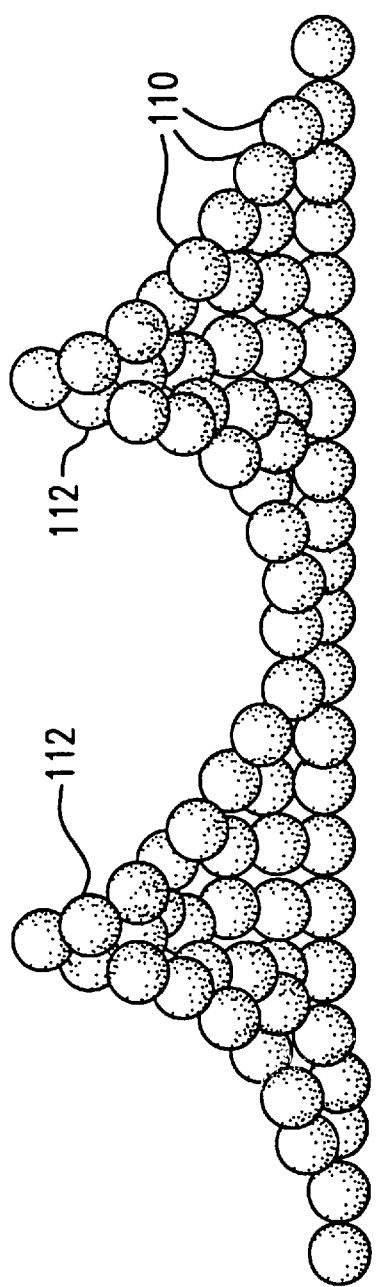
FIG. 1 is a schematic illustration of patterned granular motion in particulates of micron or millimeter size.

Referring particularly to FIGS. 1 and 3, system 100 is shown wherein a plurality of particulates 110 are disposed within the container 120. The energy application system 140 applies energy to the container 120 to vibrate at least one wall thereof, such as the bottom wall 122. The vibrations of wall 122 establish patterned granular motion in the particulates 110 to form a plurality of repeating vertically directed standing waves 112. Multiple walls can be vibrated in order to achieve a particular pattern of standing waves 112. Within container 120 there is also provided a plurality of objects 130 which are to be manipulated. Collisions between the particulates 110 of the standing waves 112 with the objects 130 dynamically arrange the objects in correspondence with the standing waves. Where the standing waves are formed as "stripes", rows of objects can be realized. By forming standing wave patterns utilizing energy applied with complex waveforms, standing waves can be located at predetermined positions.

The energy application system 140 may include one or more vibratory actuators 142 which are driven by a signal source 150. A vibratory actuator 142 may be an electromechanical or piezoelectric device, for example, that is mechanically coupled to the container wall 122. Alternately, piezoelectric devices may be incorporated into the structure of the bottom wall in the form of an integral structure. The signal source 150 includes at least one signal generator 154 having the capability of output of electrical signals having predetermined waveforms for driving a vibratory actuator 142. The signals output from signal generator 154 may be non-sinusoidal oscillatory signals to form non-uniformly spaced standing waves of the particulate media 110.

Figure 3A:
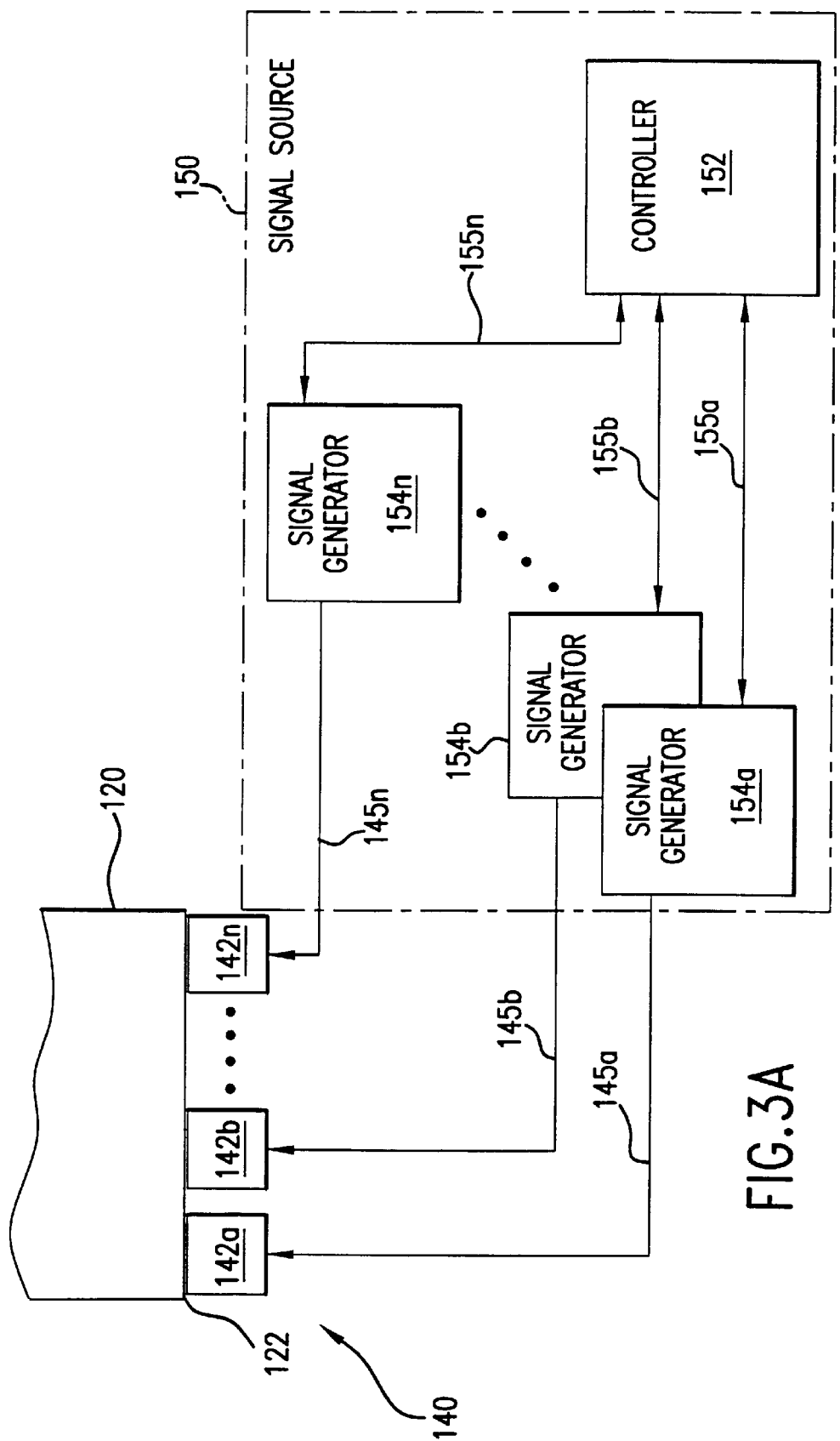
FIG. 3A is a schematic block diagram illustrating an alternative configuration for the energy application system used in the invention of the subject Patent Application.

As shown in FIG. 3A, the energy application system 140 may be formed by a plurality of vibratory actuators 142a–142n, each respectively driven by the signal source 150. Signal source 150 may be formed by a single signal generator having multiple outputs or, as shown, is formed by a plurality of signal generators 154a–154n, each having an output 145a–145n respectively coupled to the vibratory actuators 142a–142n. In order to coordinate the resultant vibratory patterns formed by the media within container 120, the signal generators 154a–154n are coupled into a controller 152 which provides command signals to each of the signal generators 154a–154n and may receive status therefrom. Controller 152 may be a microprocessor or personal computer programmed to control the signal generators. The plurality of vibratory actuators 142a–142n may be discrete devices or integrally formed in one or more walls of the container.

Figure 4:
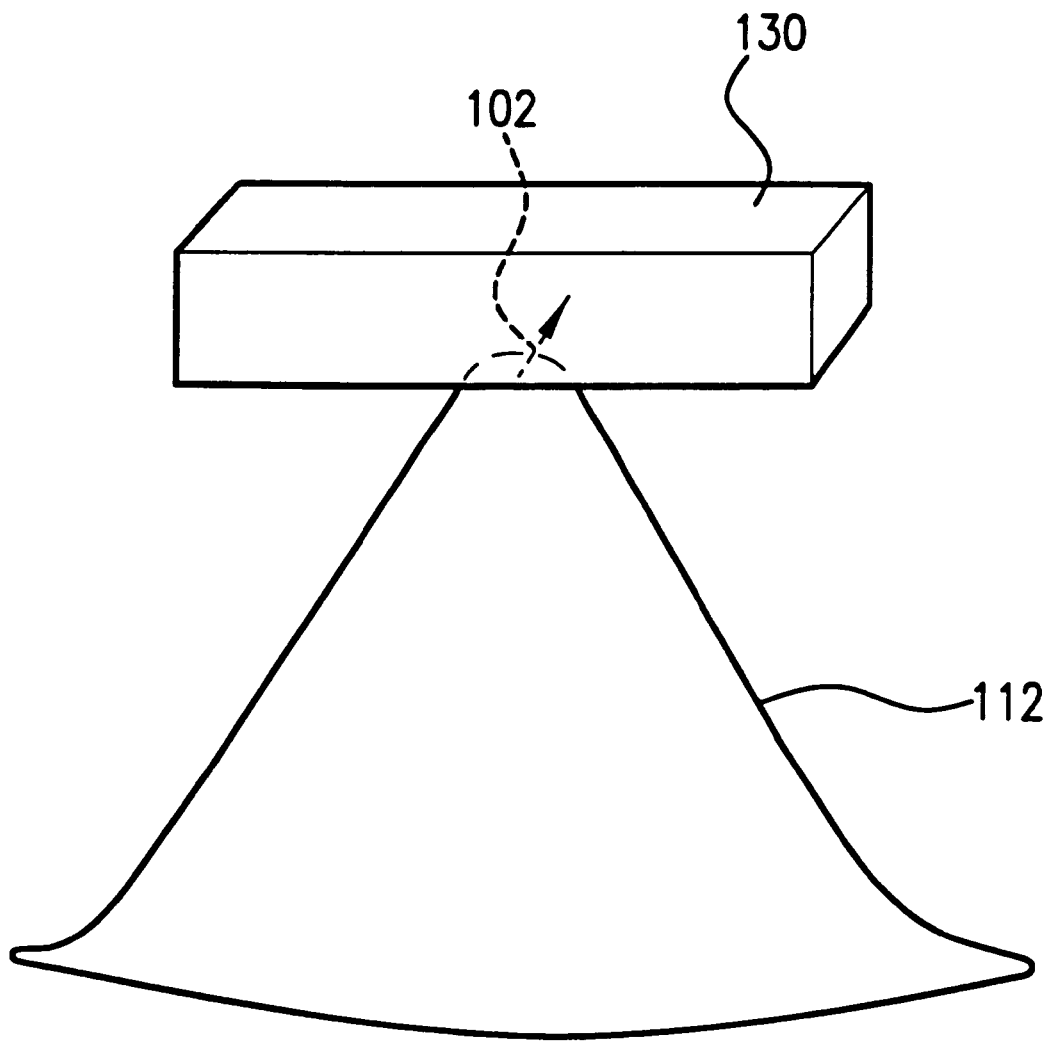
FIG. 4 is a schematic illustration of an object being manipulated by the invention of the subject Patent Application.

Referring back to FIG. 3 and additionally to FIG. 4, the energy applied to the particulates 110 within container 120 establishes vertical standing waves 112 which simultaneously mechanically manipulate the plurality of objects 130, by collisions therewith. Multiple collisions occur between the particulates in each of the standing waves with respective objects 130, applying forces thereto, represented by the directional arrow 102, to position an object dynamically in correspondence with a standing wave. Thus, where the standing waves establish particular patterns (e.g., stripes, squares, hexagons, etc.), the objects 130 can be arranged, dynamically, in correspondence with those patterns. The patterns can be established, as desired, by controlling the waveform and frequency of the energy applied to the particulates 110. The objects being manipulated can be integrated circuit chips, discrete circuit components, conductive elements, or mechanical components, for example. The dynamic arrangement of the objects can represent a plurality of substantially identical circuits or patterns formed simultaneously. Similarly, the objects manipulated can be mechanical components that are assembled into a plurality of substantially identical mechanical assemblies or systems. As will be described with respect to the embodiment of FIG. 7, a substrate 134 is positioned in the container 120 and adapted for adherence of the objects 130 thereto.

The granular behavior of particulates through vertical vibration in the container 120 down to micron scale by the addition of energy to micron-scale particulates has been established. However, in order to manipulate nanometer-scale objects, it will be necessary to establish patterned granular motion in nanometer-scale particulates, which heretofore has not been accomplished.

With respect to inducing patterned granular motion among nanometer-scale particulates, there are a number of problems associated with the addition of energy to the collection of nanometer-scale particulates through collision with the container's walls. Imperfections in the oscillating wall of the container can cause anisotropy in lateral rebound velocities of the particulates and the normal force of the oscillating wall will not likely be distributed evenly, on a nanometer scale, over the particulates, causing particulates with low fracture energies to break upon collision. Further, the precision of control of the physical oscillating wall needs to produce standing waves with nanometer-scale spacings, which is not easily accomplished with transducers of current technology.

Figure 2:
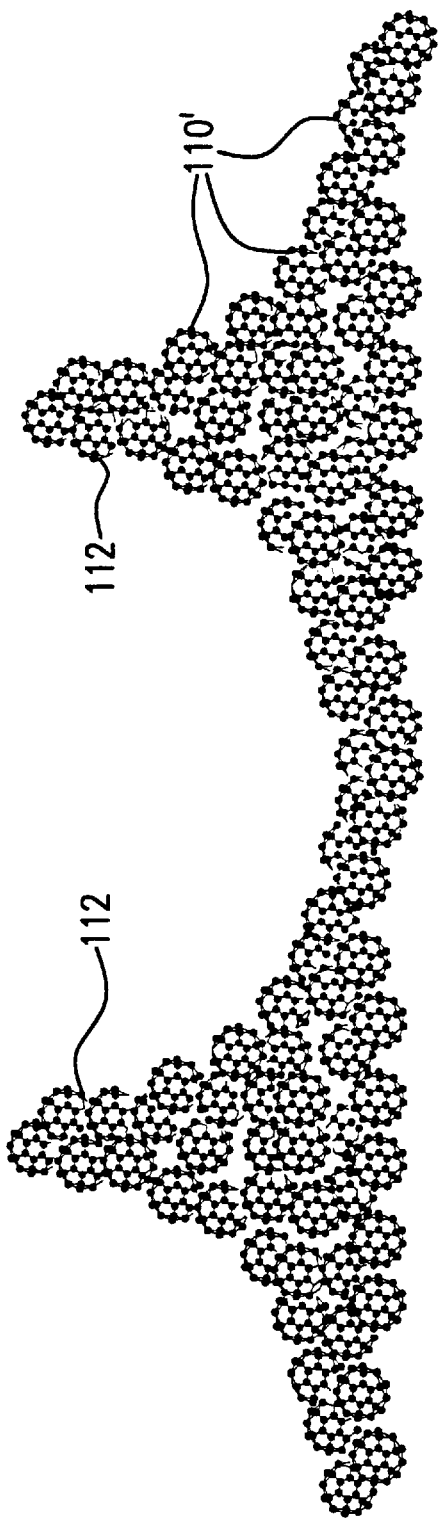
FIG. 2 is a schematic illustration of patterned granular motion utilizing $C_{60}$ molecules as particulates.
Figure 5:
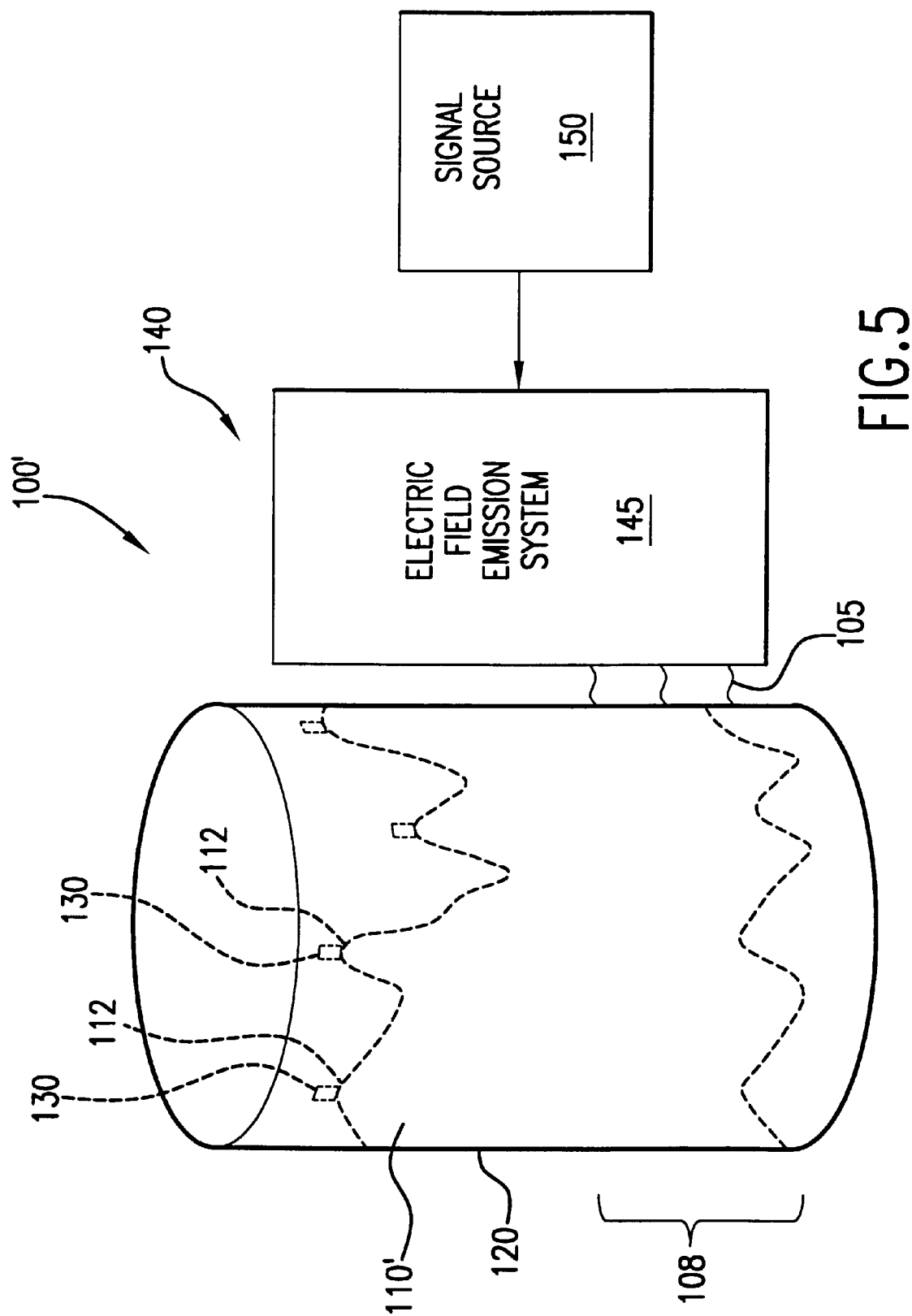
FIG. 5 is a schematic representation of an alternate embodiment of the invention of the subject Patent Application.

In order to overcome those problems, a spatially uniform electric field, represented by the lines 105, is applied to a portion 108 of container 120, as illustrated in FIG. 5. Utilizing particulates 110', which are charged, the oscillating electric field emulates a vertically vibrating surface, vertically accelerating the particulates. Using particulates of such small size introduces other problems which must be overcome. Brownian motion has to be minimal, inter-particle collisions need to properly dissipate energy, and the particulates themselves have to be of sufficient structural strength to survive collisions without fragmentation. The nanometer-scale particulates selected for use, particulates in which patterned granular motion is to be established utilizing oscillatory electric fields, are single molecules having a closed-cage structure. Such a closed-cage structure is found in the $C_{60}$ molecule, which structure is substantially spherical. Other molecules with similar properties, such as $C_{80}$, $C_{140}$, $C_{180}$ and $C_{240}$, also could serve as nanometer-scale particulates. The $C_{60}$ molecules, known as buckminsterfullerene molecules or "buckyballs" can be charged and have sufficient strength to survive the multiplicity of collisions which occur when patterned granular motion is established. As illustrated in FIG. 2, the buckminsterfullerene molecules are used as the particulates 110' and by the application of one or more oscillating electric fields establish vertical standing waves 112 corresponding to that which is seen with larger particulates that are mechanically accelerated.

In order to accelerate the particulates 110' vertically, the particulates 110' are charged and the energy application system 140 of system 100' includes an electric field emission system 145 having a plurality of electrodes disposed in proximity of container 120 for establishing one or more oscillating electric fields therein. The particulates 110' are disposed between at least two electrode plates to which electrical signals having predetermined waveforms are applied from the signal source 150. That arrangement emulates a vertically vibrating surface to establish patterned granular motion in the particulates. The vertical standing waves 112 of particulates 110' will dynamically arrange nanometer-scale objects 130. However, instead of being manipulated by mechanical collisions, the nanometer-scale objects, objects each of whose size, diameter or smallest outside contour dimension, is less than 10 microns, are manipulated by Coulombic fields.

As an example of electrode arrangements for use in establishing the required electric fields within container 120, reference is now made to FIG. 5A. The acceleration of charged particulates 110' is achieved by the electric field formed between the oppositely charged electrode plates 144 and 146 surrounding container 120. While plates 144 and 146 are depicted as being annular, such is only exemplary and may be formed in a multitude of different contours without departing from the inventive concepts embodied therein.

Referring additionally to FIG. 6, the oscillating field established between the plates 144 and 146 adds energy to the charged particulates 110', the energy addition being oscillatory, but not necessarily periodic. Each of the standing waves that are thus formed establish respective fields 106 that exert appreciable Coulombic forces on respective objects 130, which objects themselves have fields 104 that interacts with a respective field 106.

The objects to be manipulated 130 may be uncharged, or charged with a polarity either the same or opposite to that of the charge polarity of the granular standing waves 112, in order to establish a predetermined arrangement of objects or deformation thereof. Where an object 130 has a charge, having a polarity opposite to that of the representative standing wave 112, an attraction is established therebetween. As will be discussed in following paragraphs, the Coulombic charges established by the pattern of standing waves generated within container 120 can be utilized to deform objects into a predetermined configuration, as opposed to just arranging them in particular patterns, or for utilizing differences in charge to sort the objects.

Referring back to FIG. 5A, the electrode plates 144 and 146 are electrically coupled to the signal source 150, the signal source providing oscillatory signals with predetermined waveforms in order to establish a desired standing wave pattern of particulates 110' within the container 120. As discussed with respect to FIGS. 3 and 3A, the signal source 150 may be formed by one or more signal generators which can be programmed, internally or through the use of an external controller, to synthesize the required waveform pattern. The waveform of the signal generated may be expressed as a Fourier series wherein the coefficients are selected to provide an output signal waveform of a desired shape. By controlling the shape of the waveform of the signal applied to the plates 144, 146, the locations of the standing waves of particulates can be controlled. Therefore, the shape or topology of the field generated by the standing waves can also be controlled. By controlling the shape or topology of the field generated by the standing waves of particulates 110', the objects 130 can be arranged in a predetermined pattern, or otherwise manipulated in a known way.

The locations of standing waves may be further controlled by a combination of multiple electric fields established within container 120. In addition to the field established between the electrode plates 144 and 146, additional fields can be established between respective opposing pairs of side electrodes 143, that may be added in proximity to container 120. The plurality of side electrodes 143, together, substantially surround container 120, each being separately energized by signals having predetermined waveforms. As another alternative, the plates 144, 146 can be subdivided into a plurality of sections, each being separately energized. That arrangement can be used alone, or in combination with a plurality of side electrodes 143, and is analogous to the use of the plurality of vibratory actuators of the embodiment of FIG. 3A.

As an illustration of the degree of control that is achievable, reference is now made to the three-dimensional plot shown in FIG. 6A. The plot illustrates a distribution of field intensities obtained by a computer simulation. The simulation shows that the Coulombic fields can be distributed in a predetermined pattern, corresponding to the distribution of standing waves of particulates, wherein the distribution of standing waves is controlled by the electric field intensity pattern established within the container.

Nanometer-scale objects likely to be manipulated by the method and system disclosed herein include molecular diodes, molecular transistors, molecular logic devices or other circuits formed by a single molecule, molecular structures which function as "wires", molecules having medical/pharmacological significance, etc. Components of quantum computers, other novel types of nanocomputers, and nanomachines also are likely to be manipulated and assembled by this method.

While there is great interest in development of electronic devices and circuits formed from single molecules, there is also great interest in structures that can serve as interconnecting conductive elements for combining the molecular and other nanometer-scale circuits into more complex functions. One promising conductive element is the carbon nanotube. By adjustment of the location of standing waves of particulates 110', objects such as nanotubes can be arranged in a predetermined electrical circuit pattern. In order to make use of that circuit pattern, the nanotubes 130 need to be applied to a substrate, as do molecular circuit elements to be combined into more complex circuits.

Figure 7:
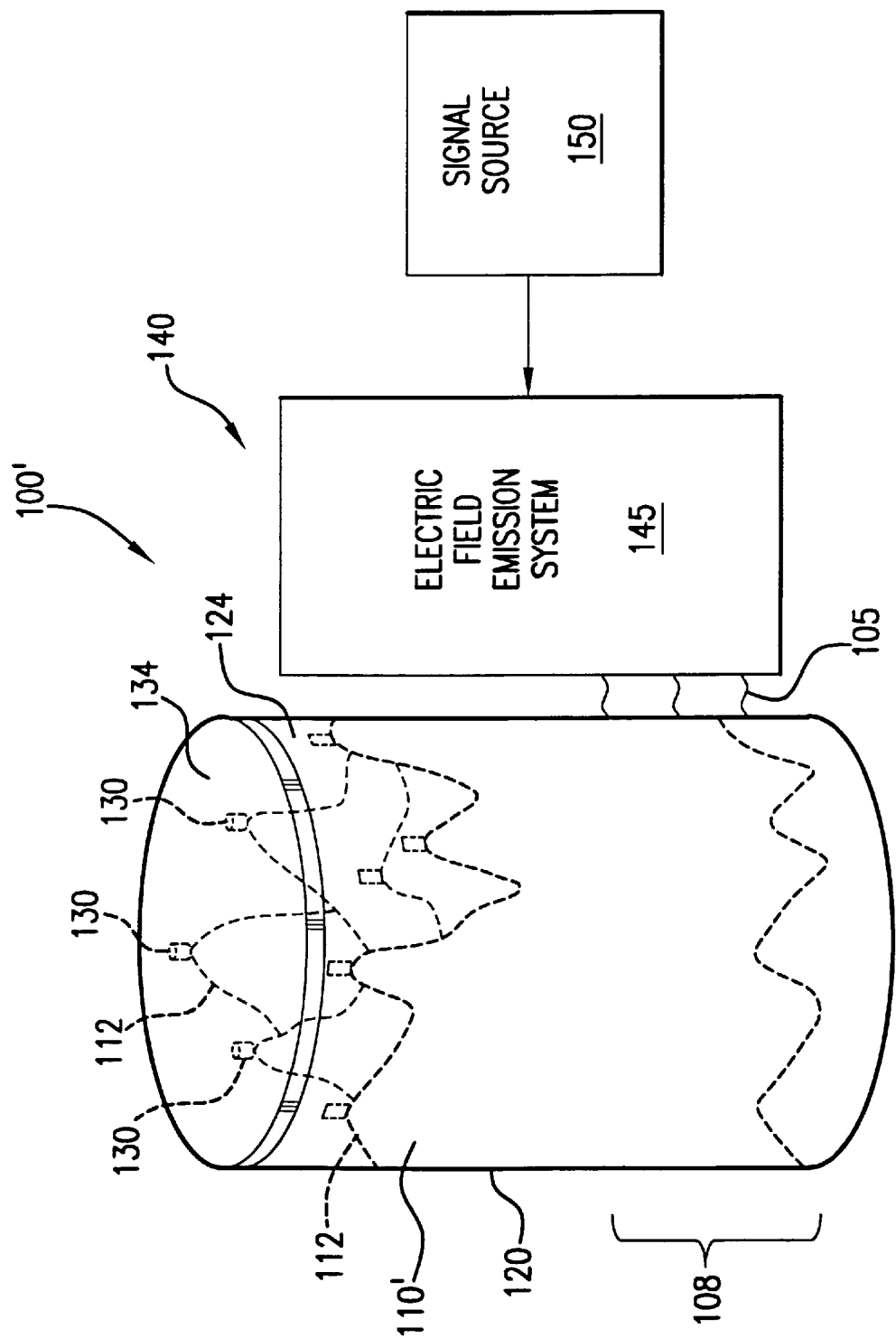
FIG. 7 is a schematic block diagram of the alternate embodiment of the present invention with a substrate incorporated at a first location.

Referring to FIG. 7, one method for applying the objects 130 to a substrate is shown. In this example, the substrate 134 is disposed above the objects 130, wherein the lower surface of the substrate 134 is adapted for adherence of the objects thereto. Such adaptation may be in the form of selecting a substrate material which has an affinity for the composition of the objects 130, the application of a coating that provides a bond between the objects 130 and the substrate 134, or the application of a particular charge to the substrate 134 to attract the objects 130. The substrate 134 may be positioned in or on container 120 prior to the establishment of the patterned granular motion or subsequent thereto. Once the objects 130 have been positioned on the bottom substrate surface, the substrate may be separated from the container 120 and passed on for further processing, which may include the separation of the substrate into a plurality of individual segments, not unlike the separation of a wafer due to a plurality of integrated circuit chips. Thus, a plurality of substantially identical and separable nanoscale circuits or circuit patterns can be formed simultaneously.

The space 124 in which the objects are disposed, between the plurality of particulates 110' and the bottom surface of the substrate 134, may be filled with a medium, such as a vacuum, a gas, a liquid, or a gel. Such a medium would facilitate processing or take advantage of a particular characteristic of the objects being manipulated, or facilitate the use of a particular material as the particulates.

Figure 8:
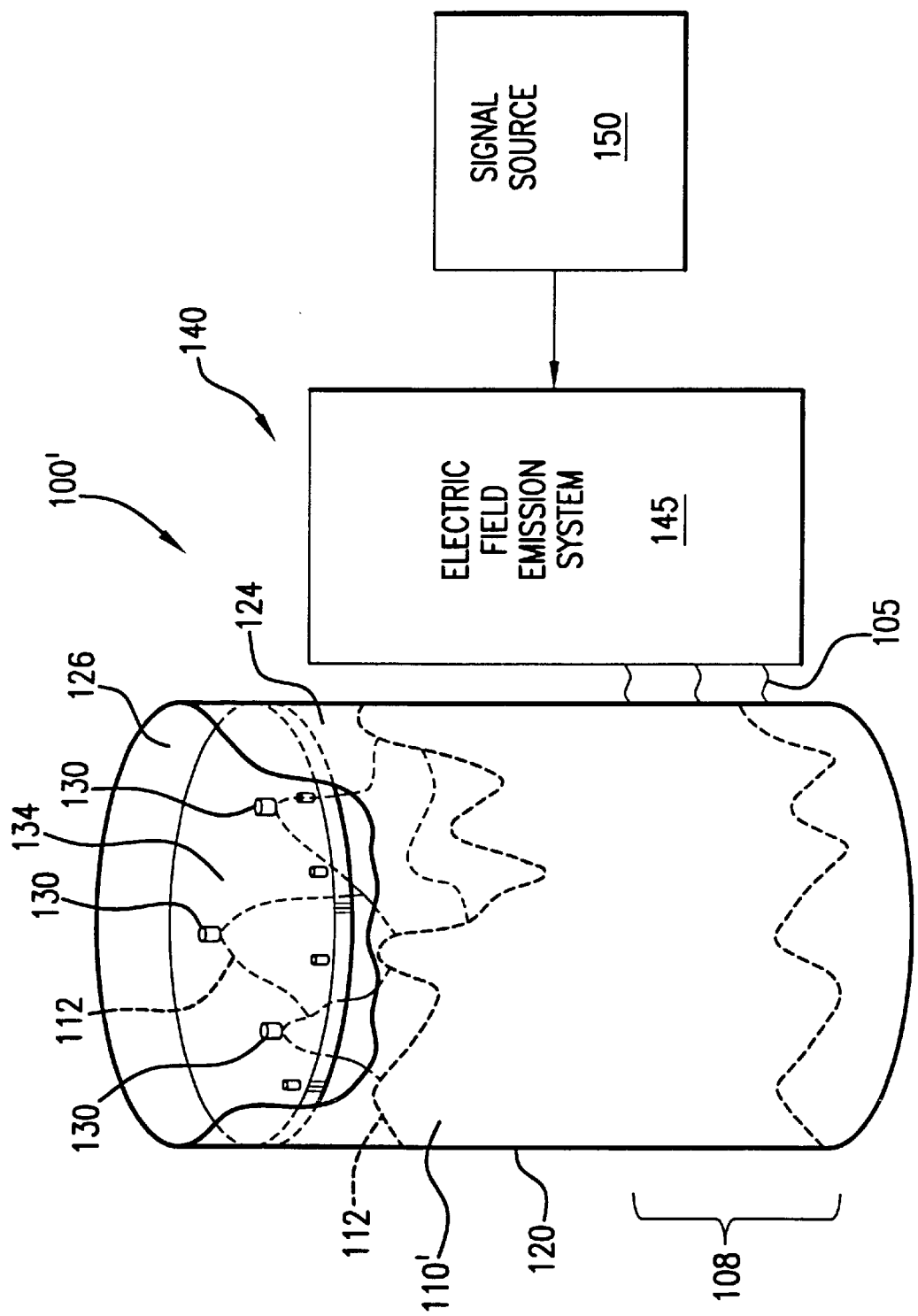
FIG. 8 is a schematic block diagram of the alternate embodiment of the present invention with a substrate incorporated at a second location.
Figure 9:
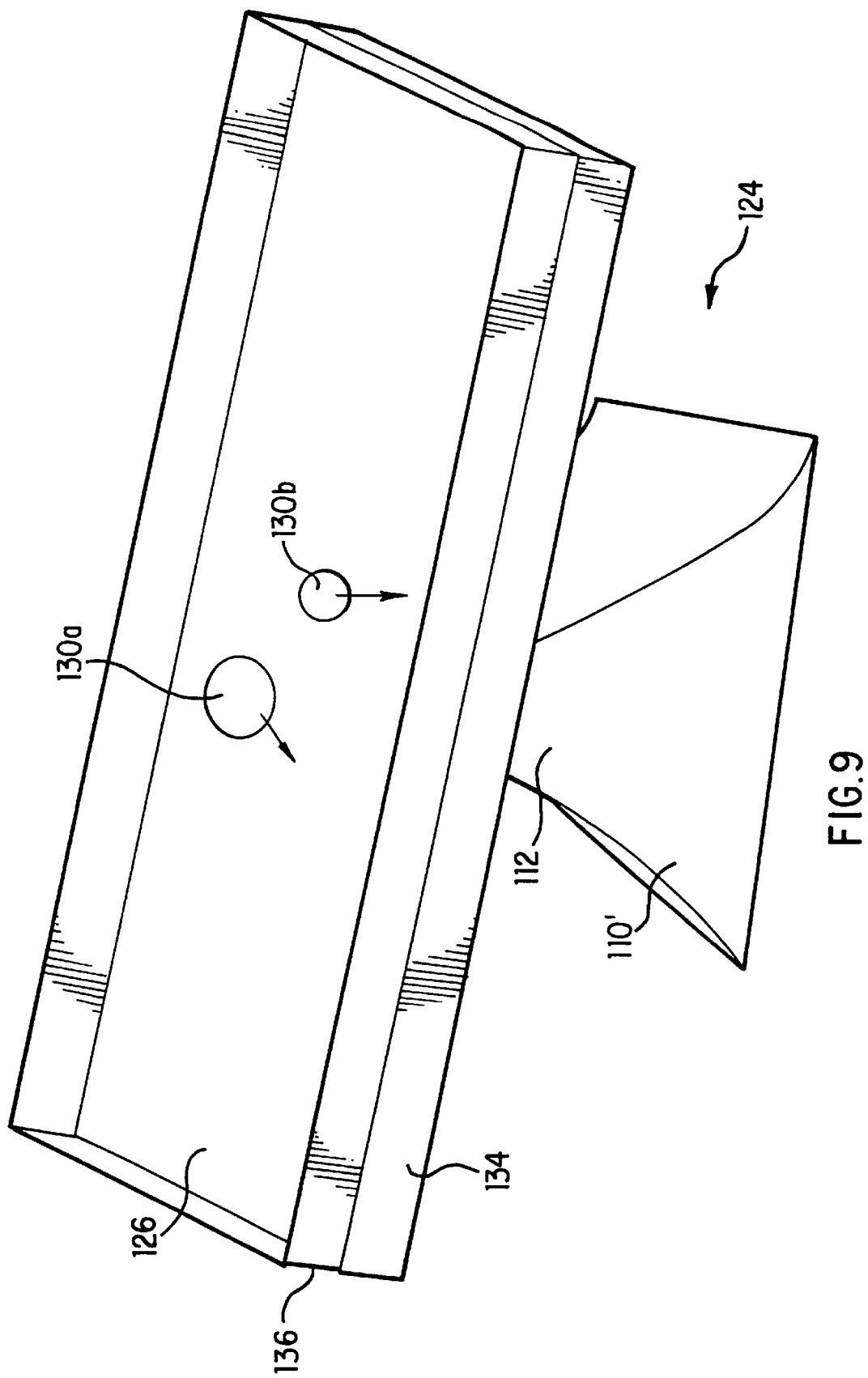
FIG. 9 is a schematic illustration of the present invention wherein the objects being manipulated are disposed in a gel.

Referring now to FIG. 8, there is shown another method by which the objects 130 are positioned and applied to a substrate. In this arrangement, the substrate 134 is positioned between the objects 130 and the particulates 110', with the electric fields generated by the standing waves 112 acting on the objects 130 through substrate 134. The objects 130 can be made to adhere to the substrate 134 by the methods previously discussed, or treated subsequent to positioning of the objects in order to affix them to substrate 134. The substrate 134 can form a closure for the portion of the container 120 where the particulates 110' are disposed. Therefore, the space 124 between the particulates 110' and the substrate 134 may be filled with a selected medium that promotes a desired characteristic, such as utilization of a vacuum to reduce resistance that the molecules of a gas or liquid would introduce. Above the substrate 134 the space 126 may be filled with the same or a different medium. For instance, if the objects 130 are molecular circuits which are formed by bulk processing in a liquid, that liquid may be maintained within the space 126 until the objects 130 are positioned in the desired configuration. The particulates, on the other hand, may be disposed in an evacuated space to reduce resistance to their movement.

Where molecules are being sorted for medical/pharmaceutical applications, the medium within the space 126 is likely to be a gel. As shown in FIG. 9, the gel 136 is disposed above the substrate 134 with the objects 130a and 130b being displaced in different directions as a result of the field formed by the standing wave 112 of particulates 110', the particulates 110' being in a non-gel medium. Such gels already are widely used in electrophoretic processes. The patterned granular motion established in nanometer-scale particulates provides much finer control of the electrophoretic process, and the capability to perform that process in two or three dimensions.

Referring now to FIG. 10, there is shown an illustration of a carbon nanotube 130c disposed on the substrate 134. In addition to positioning the nanotube 130c at a precise location on the substrate 134, the standing waves 112 of particulates 110' can be utilized to distort the nanotube 130c. The distortion may range from a slight angular offset or translation, where the electrical characteristics of the nanotube are unaffected, to a kink, where the electrical characteristics of the nanotube are changed as a result. Thus, where the standing waves take the form of stripes 112', as shown in FIGS. 11A, 11B and 11C, a nanotube 130c that is charged negatively will align itself with a respective stripe 112' of opposite charge polarity. Thus, as in FIG. 11C, where a respective stripe 112' has an arcuate shape, the nanotube 130C will likewise be bent into that arcuate contour. Where the radius of the arcuate contour is small, as illustrated in FIG. 11A, the nanotube 130c will be bent to the extent of "kinking", wherein the electrical characteristics of the nanotube is affected. In addition to such deformations, the nanotube 130c can be translated from one position to another, as shown in FIG. 11B. Where the standing waves are positioned in more complex patterns, the nanotubes 130c can likewise be deformed into more complex shapes.

Thus, predetermined topological configurations of patterned granular formations can be selectively formed by the application of oscillating signals having predetermined waveforms to the electric field emission system 145. Electric fields established by the electric field emission system 145, in turn, add energy to the charged particulates 110' disposed in container 120, the energy being sufficient to establish patterned granular motion in the particulates. The patterned granular motion of charged particulates 110' consists of respective standing waves, with the standing waves generating electric fields that are used to arrange objects dynamically. Through the use of electric fields to establish patterned granular motion, nanometer-scale particulates, such as $C_{60}$ can be utilized to manipulate nanometer-scale objects. Nanometer-scale objects such as conductors defined by carbon nanotubes or polyphenylene molecular wires, molecules defining molecular electronic devices, quantum computer components, or nanomechanical components, can thereby be manipulated en masse.

For larger, micron and millimeter scale devices, the energy can be added to particulates utilizing vibratory transducers to displace a wall of the container 120 and thereby establish patterned granular motion. The standing waves formed by the patterned granular motion then may be utilized to manipulate objects by virtue of the collision between the particulates in the standing waves and the respective objects. Like the arrangement shown in FIG. 7, with respect to the placement of a substrate, the objects manipulated by the standing waves generated by the vibratory displacement of a container wall, can be made to adhere to the lower surface of a substrate to provide a plurality of substantially identical patterns thereon.

Figure 12:
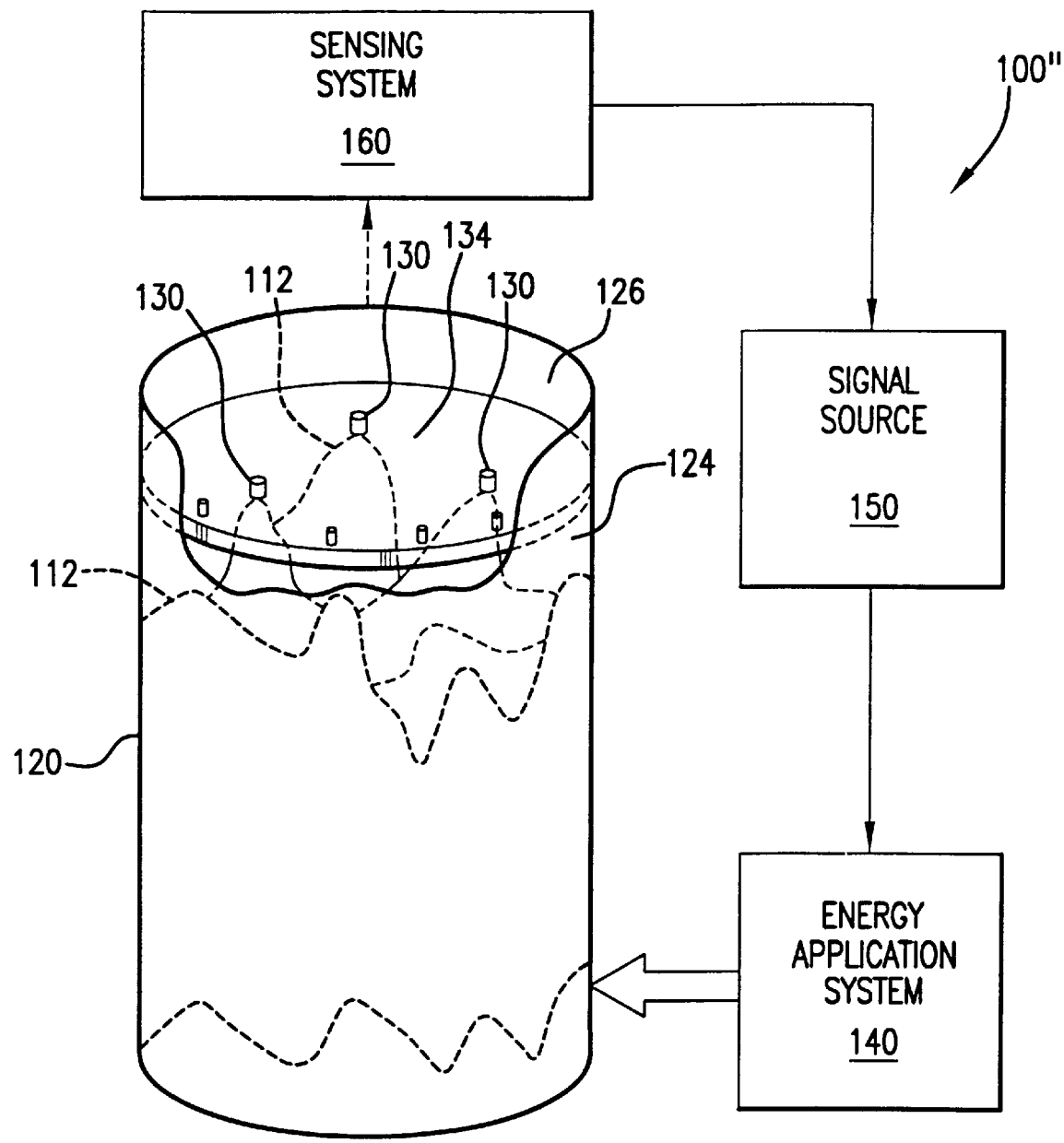

As previously discussed, predetermined standing wave patterns of particulates are established by specifying predetermined coefficients of one or more Fourier series representing waveforms supplied by the power source 150. The manipulation of objects may be carried out in discrete steps, with the waveforms of signals from power source 150 being changed over time in accordance with a predetermined program. The manipulation of the objects, however, can be made more precise if the waveforms output from power source 150 are actively modified in response to the manipulation. Such a feedback arrangement is schematically illustrated for system 100" in FIG. 12. As discussed previously, the signal source 150 provides signals having waveforms established to provide predetermined standing wave patterns of particulates. The output from power source 150 is coupled to the energy application system 140 for transferring the energy from the power source output to the particulates within container 120. As discussed previously, the energy application can be either mechanical or electrical.

Additionally, robotic manipulation system 100" includes a sensing system 160 to provide feedback for adjustment of the one or more waveforms output from power source 150, to thereby adjust the positions of standing waves within container 120. While system 100" manipulates a plurality of objects 130 in parallel, sensing system 160 monitors the position and/or other characteristics of a portion of the objects, as few as one. Based on the sensed position or other measured characteristic, sensing system 160 provides an output to power source 150 to alter the one or more waveforms output thereby. Sensing system 160 may include optical/imaging or scanning probe microscopy equipment to sense position of the objects. Electrical and/or optical sensing may be included to monitor other characteristics of the objects that change as the objects are manipulated. Thus, probes of an atomic force microscope can be used to make contact with a carbon nanotube that is being manipulated, the probes being coupled to electronic monitoring equipment for measuring the electrical conductance, for example, of the nanotube and detect the formation of a "kink" therein. One use of feedback, for example, is to provide more precise manipulation of objects.

The method for robotic manipulation of a plurality of objects includes the steps of providing a container, the container being capable of generating rapid granule rebounds at a high frequency, and providing a plurality of particulates in the container. The objects to be manipulated are added to the container and the particulates are agitated with energy having predetermined waveforms to generate standing wave patterns therewith (i.e., patterned granular motion). The standing wave patterns dynamically arrange the objects, where the arrangements can be predetermined circuit configurations of objects defined by electronic devices or electrical circuit patterns of objects defined by electrically conductive structures, for example. The arrangement of objects may also form other types of assemblies as well. The method also includes the positioning of a substrate in the container, wherein the substrate is adapted for adhesion of the objects thereto. The positioning of the substrate can precede the agitation of the particulates, or be subsequent thereto. The agitation of the plurality of particulates may be achieved by vibrating a wall of the container. Another method of agitating particulates, where the particulates are charged with a predetermined polarity, is to establish an oscillating electric field within the container. The objects to be manipulated have a size less than 10 microns, i.e., a diameter less than 10 microns, or the smallest dimension of the object's outer contour being less than 10 microns, and the objects may be single molecules.

The particulates may themselves be individual molecules, wherein such molecules have a closed-cage structure, e.g., a buckminsterfullerene molecule. Both the particulates and objects can be provided in a medium independently selected from the group consisting of a vacuum, a gas, a liquid, and a gel. Using this method, a plurality of substantially identical nanoscale structures (e.g., electrical, quantum, or mechanical) can be formed on a substrate. Thus, the fabrication of the plurality of circuits, circuit patterns, systems, machines, or assemblies takes place in parallel, constituting a bulk fabrication process.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is being claimed is:

1. A method for robotic manipulation of a plurality of objects, comprising the steps of:
   a. providing a container;
   b. providing a plurality of particulates in said container;
   c. adding said objects to be manipulated to the container, said objects being distinct from said plurality of particulates;
   d. agitating said plurality of particulates with energy having predetermined waveforms to generate standing wave patterns therewith, said standing wave patterns of particulates respectively imparting displacement forces to said objects for dynamically arranging said objects; and,
   e. positioning a substrate in said container, said substrate being adapted for adhesion of said objects thereto.

2. The method as recited in claim 1 where the step of exciting said plurality of particulates includes the step of vibrating a wall of said container.

3. The method as recited in claim 1 where the step of providing a plurality of particulates includes the step of providing particulates where each particulate is a single molecule.

4. The method as recited in claim 3 where the step of agitating said plurality of molecules includes the step of establishing and applying oscillatory electric fields thereto.

5. The method as recited in claim 4 where the step of establishing and applying oscillatory electric fields includes the step of generating predetermined waveforms for establishing said oscillatory electric fields and thereby dynamically arranging said objects in a predetermined pattern.

6. A method for robotic manipulation of a plurality of objects, comprising the steps of:
   a. providing a container;
   b. providing a plurality of ionized molecules in said container;
   c. adding said objects to be manipulated to the container, said objects being distinct from said plurality of particulates and having a size less than 10 microns;
   d. agitating said plurality of ionized molecules with electric fields having predetermined waveforms to generate standing wave patterns therewith, said standing wave patterns of ionized molecules respectively imparting displacement forces to said objects for dynamically arranging said objects; and,
   e. positioning a substrate in said container, said substrate being adapted for adhesion of said objects thereto.

7. The method as recited in claim 6 where the step of positioning a substrate includes the step of locating said substrate above said objects.

8. The method as recited in claim 6 where the step of positioning a substrate includes the step of locating said substrate between said ionized molecules and said objects.

9. The method as recited in claim 6 where the step of adding said objects includes the step of providing individual molecules as objects to be manipulated.

10. The method as recited in claim 9 where the step of agitating includes the step of generating said predetermined waveforms to dynamically arrange said objects in an electrical circuit pattern.

11. The method as recited in claim 9 where the step of providing molecules includes the step of providing carbon nanotubes.

12. The method as recited in claim 6 where the step of providing a plurality of ionized molecules includes the step of providing said molecules in a medium selected from the group consisting of a vacuum, a gas, a liquid, and a gel.

13. The method as recited in claim 12 where the step of adding said objects includes the step of providing said objects in a medium selected from the group consisting of a vacuum, a gas, a liquid, and a gel.

14. The method as recited in claim 6 where the step of adding said objects includes the step of providing molecular circuit elements as objects to be manipulated and the step of agitating includes the step of generating said predetermined waveforms to dynamically arrange said molecular circuit elements into a plurality of substantially identical nanoscale circuits.

15. The method as recited in claim 6 where the step of adding said objects includes the step of providing nanometer-scale mechanical elements as objects to be manipulated and the step of agitating includes the step of generating said predetermined waveforms to dynamically arrange said mechanical elements into a plurality of substantially identical nanoscale machine assemblies.

* * * * *